(12) United States Patent
Kawashima (10) Patent No.: US 6,825,900 B2
(45) Date of Patent: Nov. 30, 2004

(54) DISPLAY APPARATUS (75) Inventor: Toshitaka Kawashima, Kanagawa (JP)

(73) Assignee: Sony Corporation, Tokyo (JP)

( * ) Notice: Subject to any disclaimer, the term of this patent is extended or adjusted under 35 U.S.C. 154(b) by 500 days.

(21) Appl. No.: 09/927,516

(22) Filed: Aug. 13, 2001

(65) Prior Publication Data
US 2002/0047956 A1 Apr. 25, 2002

(30) Foreign Application Priority Data

Aug. 31, 2000 (JP) .......................................... 2000-263628

(51) Int. Cl.$^7$ ............................................. G02F 1/1335
(52) U.S. Cl. ....................................................... 349/106
(58) Field of Search ..................... 349/106, 42; 428/690

(56) References Cited

U.S. PATENT DOCUMENTS 5,798,744 A * 8/1998 Tanaka et al. ................. 345/92
6,219,113 B1 * 4/2001 Takahara ....................... 349/42
6,410,168 B1 * 6/2002 Tamura ......................... 428/690
6,628,355 B1 * 9/2003 Takahara ..................... 349/106

* cited by examiner

Primary Examiner—John F. Niebling
Assistant Examiner—Andre' Stevenson
(74) Attorney, Agent, or Firm—Oblon, Spivak, McClelland, Maier & Neustadt, P.C.

(57) ABSTRACT

A display apparatus which enables the display screen to be increased in size. The display apparatus includes a panel substrate operating as a display screen, plural display devices arranged in a matrix on the panel substrate, and a drive circuit substrate having a drive circuit for driving each display device. The panel substrate is subdivided into plural areas by driving wiring adapted for driving the display devices, and a plurality of the drive circuit substrates are provided in association with the respective areas.

11 Claims, 12 Drawing Sheets

DISPLAY APPARATUS

BACKGROUND OF THE INVENTION

1. Field of the Invention

This invention relates to a display apparatus comprised of a display element arranged on a panel substrate.

2. Description of Related Art

As a flat type display apparatus, a liquid crystal display (extraneous light emission display), an organic EL (electroluminescence) display and a plasma display (PDP) are being put to use.

Figure 1:
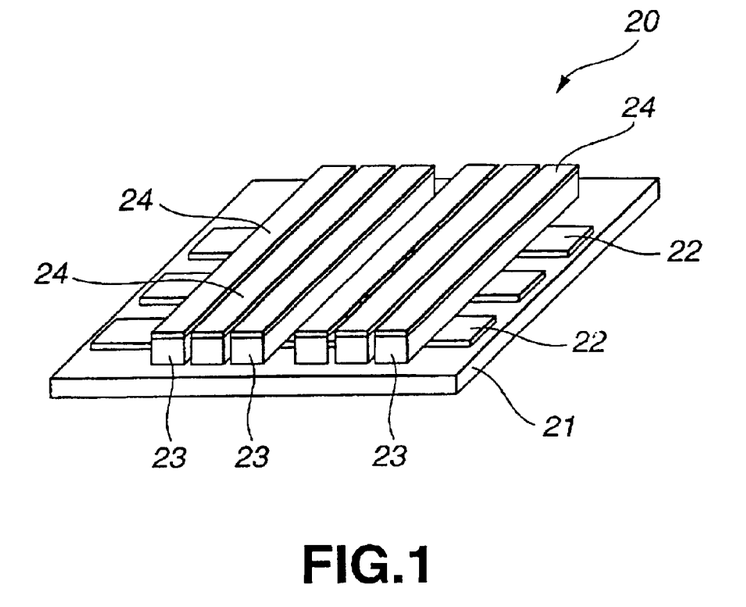
FIG. 1 is a perspective view showing an illustrative structure of a conventional organic EL display device.
Figure 2:
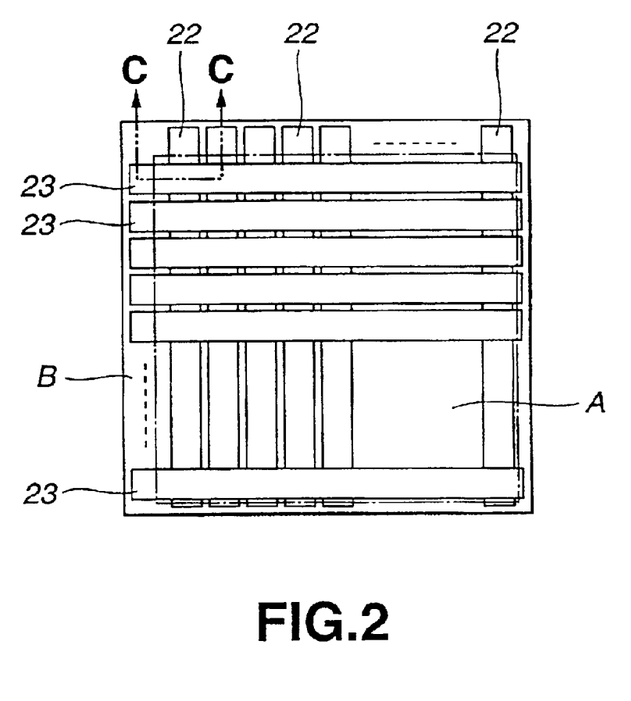
FIG. 2 is a plan view showing an illustrative structure of a conventional organic EL display device.

FIGS. 1 and 2 show an illustrative structure of an organic EL display, among the above-mentioned plural displays, which recently is attracting particular notice. An illustrative structure of the organic electroluminescence (EL) display is shown in FIGS. 1 and 2. This organic EL display 20 is comprised of a transparent substrate 21, a plurality of transparent electrodes 22, arranged in stripes, as anodes, on the transparent substrate 21, a plurality of organic layers 23, each made up of a positive hole transporting layer and a light emitting layer, formed at right angle to the transparent electrodes 22 and a plurality of cathodes 24 formed on the organic layers 23, whereby organic EL devices are formed at the intersecting points of the transparent electrodes 22 and the cathodes 24 to form a light emitting area A comprised of a matrix of these organic EL devices, and a contact electrode B is formed in the vicinity of the light emitting area A for taking out the light emitting area to an external circuit or to an inner drive circuit.

Although not shown, in the organic EL display 20, an insulating layer is usually provided between the neighboring transparent electrodes 22, whereby the shorting across neighboring transparent electrodes 22 and that across the transparent electrodes 22 and the cathodes 24 may be prevented from occurring.

Figure 3:
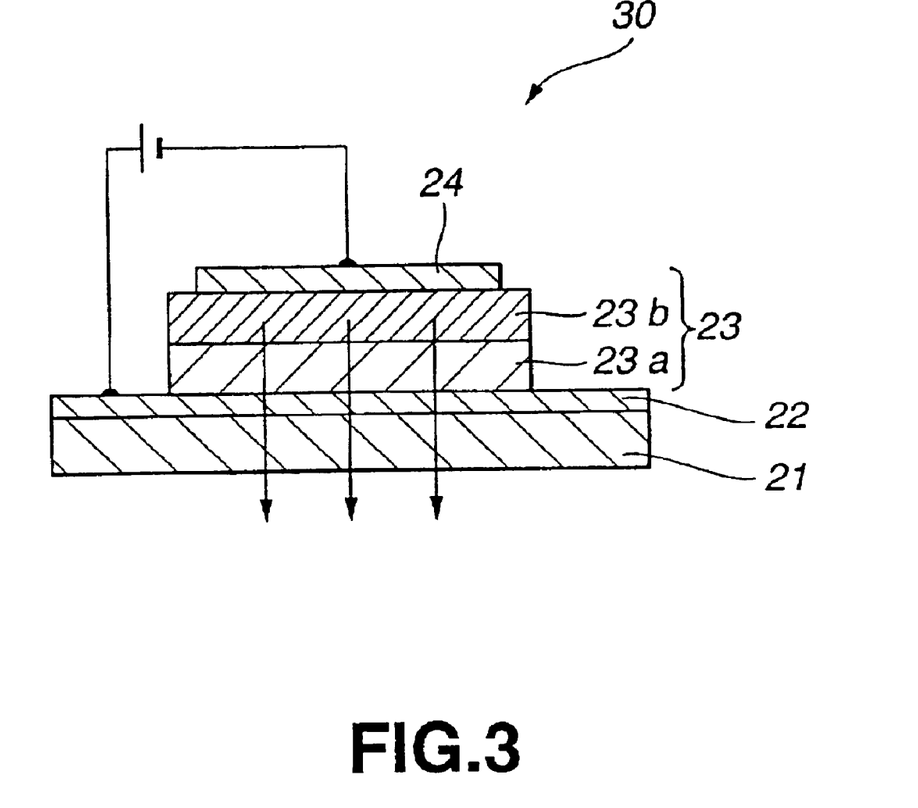
FIG. 3 is a cross-sectional view showing an illustrative structure of an organic EL device used in the organic EL displat shown in FIGS. 1 and 2.

In such organic EL display, there is, for example, a single hetero type organic EL device 30, shown in FIG. 3, as an organic EL device constructed at an intersection 30 includes a transparent substrate 21, such as a glass substrate, on which there are sequentially formed a transparent electrodes 22 of, for example, ITO (indium tin oxide), an organic layer 23, made up of a positive hole transporting layer 23a and a light emitting layer 23b, and a cathode 24, arranged in this order.

If, in the above-described organic EL device 30, a positive voltage and a negative voltage are applied to the anodes and cathodes, the positive holes implanted from the anodes reach the light emitting layer 23b through the positive hole transporting layer 23a, whilst the electrons implanted at the cathode reach the light emitting layer 23b, so that electron-positive hole recombination occurs in the light emitting layer 23b. The light of a pre-set wavelength is emitted at this time and radiated from the side transparent substrate 21 to outside as indicated by arrow in FIG. 3.

So, a wide variety of display apparatuses, employing a wide variety of display devices, are being developed and put to practical use.

However, although the liquid crystal display device is of low voltage and low power consumption and hence may be driven by a general-purpose integrated circuit, liquid crystal display is low in response speed, so that an image needs to be displayed by an active matrix system in which TFTs (thin-film transistors) are built into each pixel, thus raising the production cost.

In an autogenous light emission display device, such as organic EL device or plasma display, the display dynamic range is wide such that a bright image can be displayed. However, the driving voltage is as high as approximately 100 V, thus presenting driving difficulties in the general-purpose integrated circuit.

In the screen size is to be increased with the organic EL device, it is not possible with the conventional passive matrix system to cause the entire surface of the large-sized display device to emit light by reason of voltage drop caused by the wiring resistance of the drive circuit mounted in the vicinity of the display device.

SUMMARY OF THE INVENTION

It is therefore an object of the present invention to provide a display device in which it is possible to increase the screen size.

The present invention provides a display apparatus which enables the display screen to be increased in size. The display apparatus includes a panel substrate operating as a display screen, plural display devices arranged in a matrix on the panel substrate, and a drive circuit substrate having a drive circuit for driving each display device. The panel substrate is subdivided into plural areas by a driving wiring adapted for driving the display devices, and a plurality of the drive circuit substrates are provided in association with the respective areas.

According to the display apparatus of the present invention, the driving wiring can be shorter in length by subdividing the panel substrate carrying the display devices and the drive circuit substrate to eliminate voltage drop caused by the resistance of the driving wiring to provide for stable driving of the display devices.

That is, with the display apparatus according to the present invention, in which the drive circuit substrate for driving the display devices is subdivided to reduce the length of the wiring to eliminate the voltage drop ascribable to the wiring resistance to provide for stable driving of the display devices. By subdividing the panel carrying the display devices and the drive circuit substrate, maintenance or repair may be performed from area to area to keep the quality of the display. According to the present invention, if the display screen is increased in size, the display devices can be driven in stability to realize a high quality display apparatus.

DESCRIPTION OF THE PREFERRED EMBODIMENTS

Referring to the drawings, preferred embodiments of according to the present invention will be explained in detail.

Figure 4:
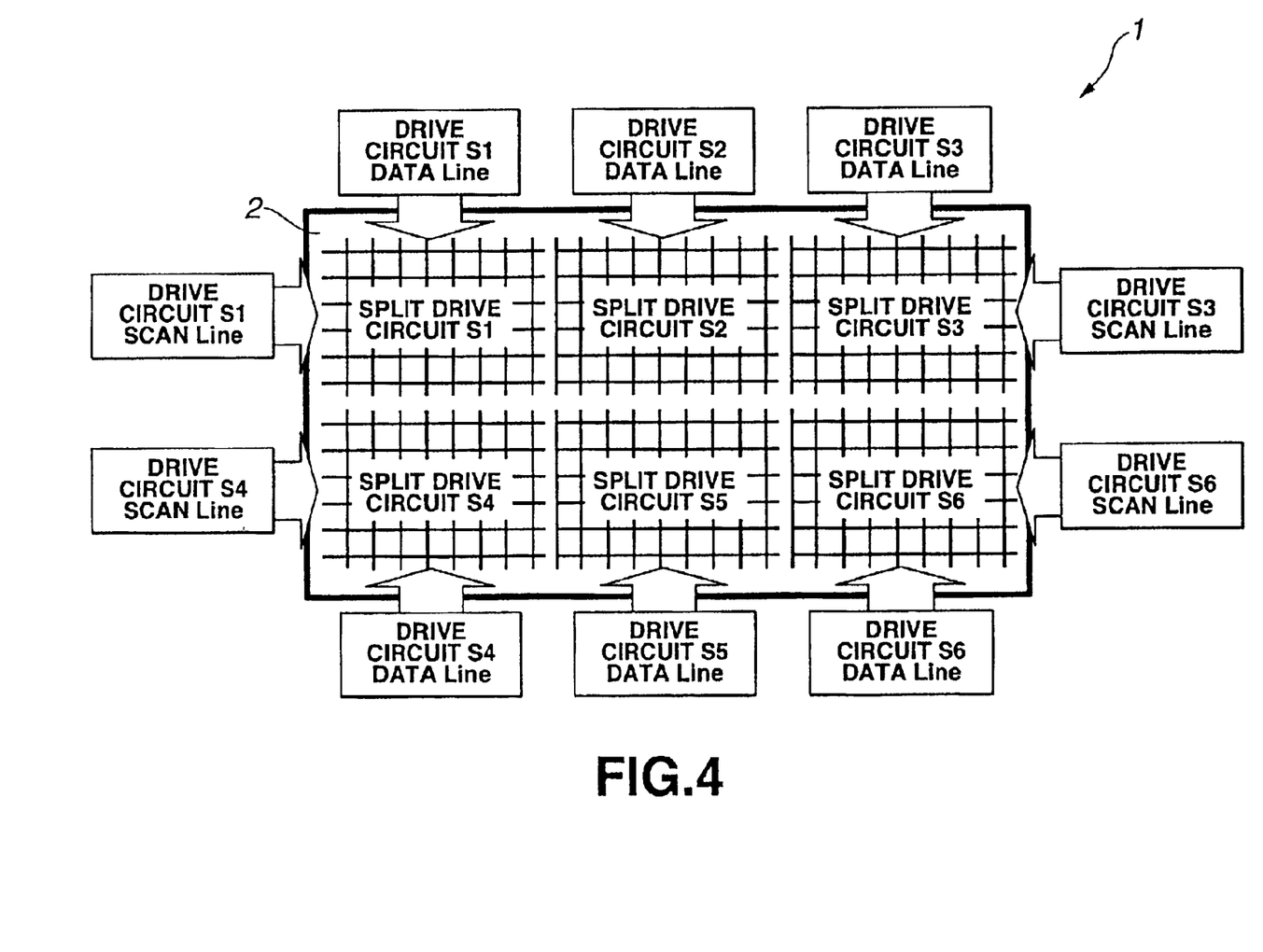
FIG. 4 is a schematic plan view showing an illustrative structure of a display according to the present invention and particularly showing the state in which the drive circuit is split on the panel substrate.
Figure 5:
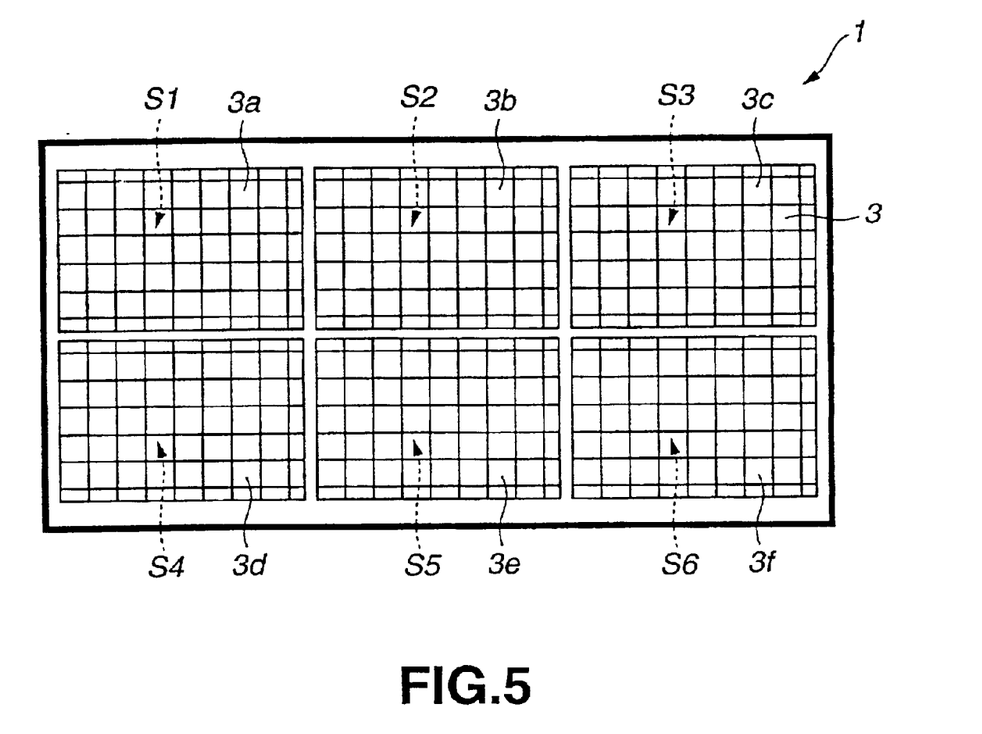
FIG. 5 is a schematic plan view showing an illustrative structure of a display according to the present invention and particularly showing the state in which a drive circuit substrate is arranged on a split drive circuit area.

In FIGS. 4 and 5, there is schematically shown an illustrative structure of a display embodying the present invention. In the following explanation, an organic EL display employing an organic RL device as a display element is taken as an example.

This display 1 is a so-called passive matrix display in which organic EL devices are used as display devices and arrayred in a matrix of vertical columns and horizontal rows in the form of a simple lattice. This passive matrix system is such a one in which organic EL devices are formed between two intersecting electrodes, with the respective organic EL devices performing the role of display devices and switching devices simultaneously. These organic EL devices are formed in an array of simple lattice on a panel substrate 2, whilst driving lines (data lines and scanning lines) are arranged for extending in the vertical and horizontal directions. These organic EL devices are driven by the driving current being supplied from a drive circuit substrate mounted on the surfaces thereof opposite to the panel substrate 2.

According to the present invention, the panel substrate 2 is divided by driving lines used for driving the display devices arranged on the panel substrate 2 into plural drive circuit areas, in place of providing a sole drive circuit substrate of a size corresponding to the size of the panel substrate 2 on the entire panel surface, so that the panel substrate 2 is subdivided into plural drive circuit substrates in register with respective driving communication areas. Meanwhile, in the display 1 shown in FIG. 4, the panel carrying the organic EL devices are split into six drive circuit areas S1 to S6. FIG. 5 shows that six drive circuit substrates 3a to 3f are arrayed in register with the as-split six drive circuit areas S1 to S6, respectively. These sub-divided drive circuit substrates 3a to 3f are interconnected in cascade. In the following explanation, the drive circuit substrates 3a to 3f are sometimes comprehensively termed drive circuit substrate 3.

On these drive circuit substrates 3, a calculating circuit, a memory circuit, a transmission/reception circuit, a selector circuit for selecting the driving range on the large-format screen, and input/output terminals for information signals, are mounted; in addition to the drive circuit IC for the organic EL devices. There are also bored through-holes in the drive circuit substrate 3 for connection to terminals of the organic EL devices by e.g., bump connection.

Figure 6:
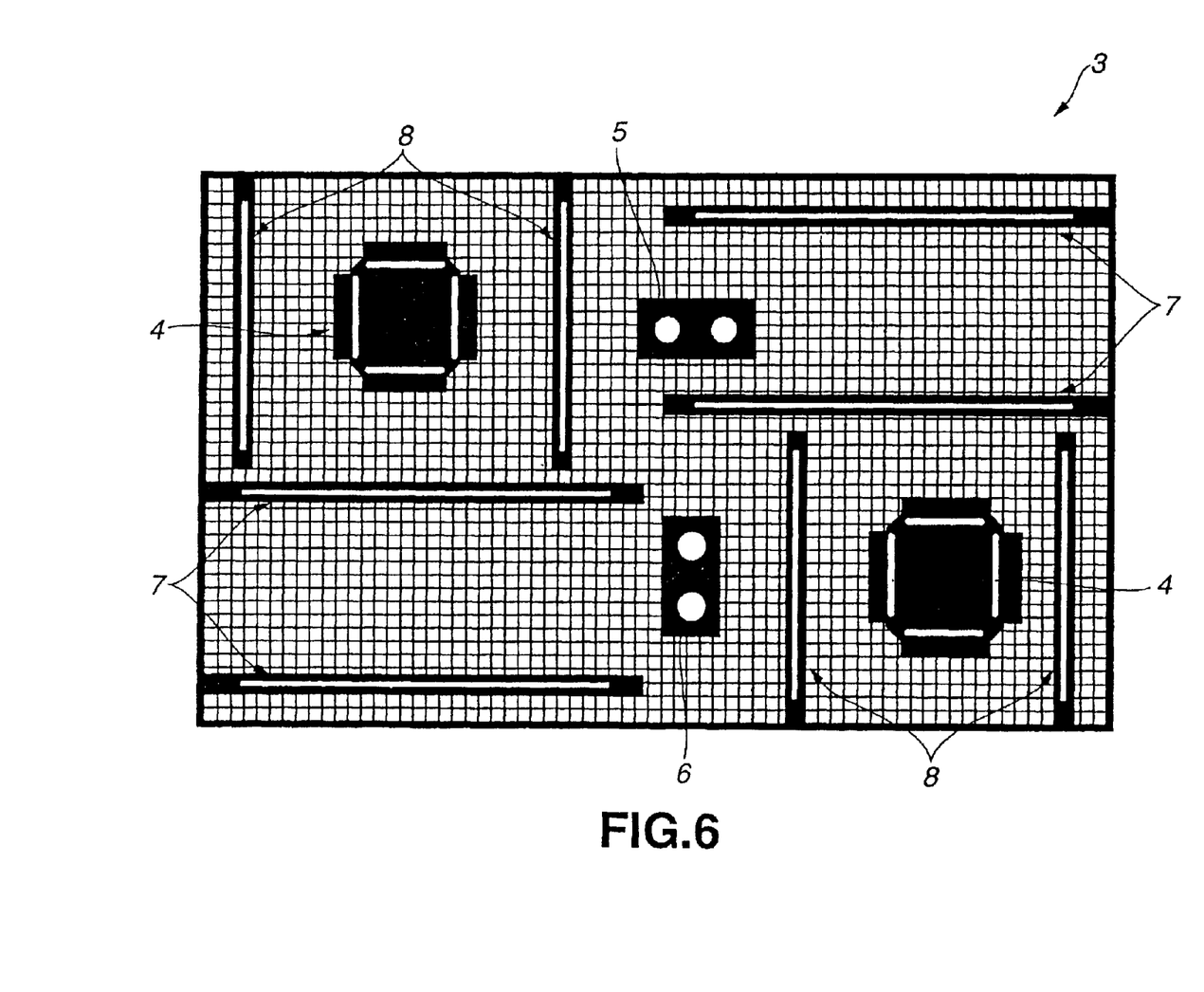
FIG. 6 is a plan view showing an illustrative structure of the drive circuit substrate.

FIG. 6 shows an illustrative structure of each drive circuit substrate 3. In FIG. 6, there are schematically shown a drive circuit IC 4, picture signal/power supply terminals 5, 6, a data line terminal 7 and a scan line terminal 8. The picture signal/power supply terminals 5,6 are terminals for inputting/outputting picture signals and the current from an external image transfer device, not shown. The data line 7 and the scan line terminal 8 are associated with respective driving lines (data lines and scan lines) arranged in a matrix and are used for outputting the driving current corresponding to the driving signals to the organic EL devices.

At least one terminal of the drive circuit substrate 3 is required for one driving line (data line, scan line). If reliability of the bump connection of the terminals is taken into consideration, it is desirable to provide plural connection terminals. By providing plural bump terminals, bump connection may be improved in reliability.

Meanwhile, in the drive circuit substrate 3 shown in FIG. 6, the data line driving area is split in two portions, in each of which two data line terminals 7 are arrayed so that a sum total of four data line terminals 7 are formed. The same is valid for the scanning line, that is, the scan line driving area is divided in the substrate into two portions in each of which two scan line terminals 8 are arrayed so that a sum total of four scan line terminals 8 are formed.

That is, there are two terminals supplying the driving current to a given organic EL device for each of the data line terminal 7 and a scan line terminal 8. Thus, if the one of the terminals falls into disorder, the other terminal is able to supply the drive circuit to the organic EL device to improve the reliability in device driving.

Figure 13:
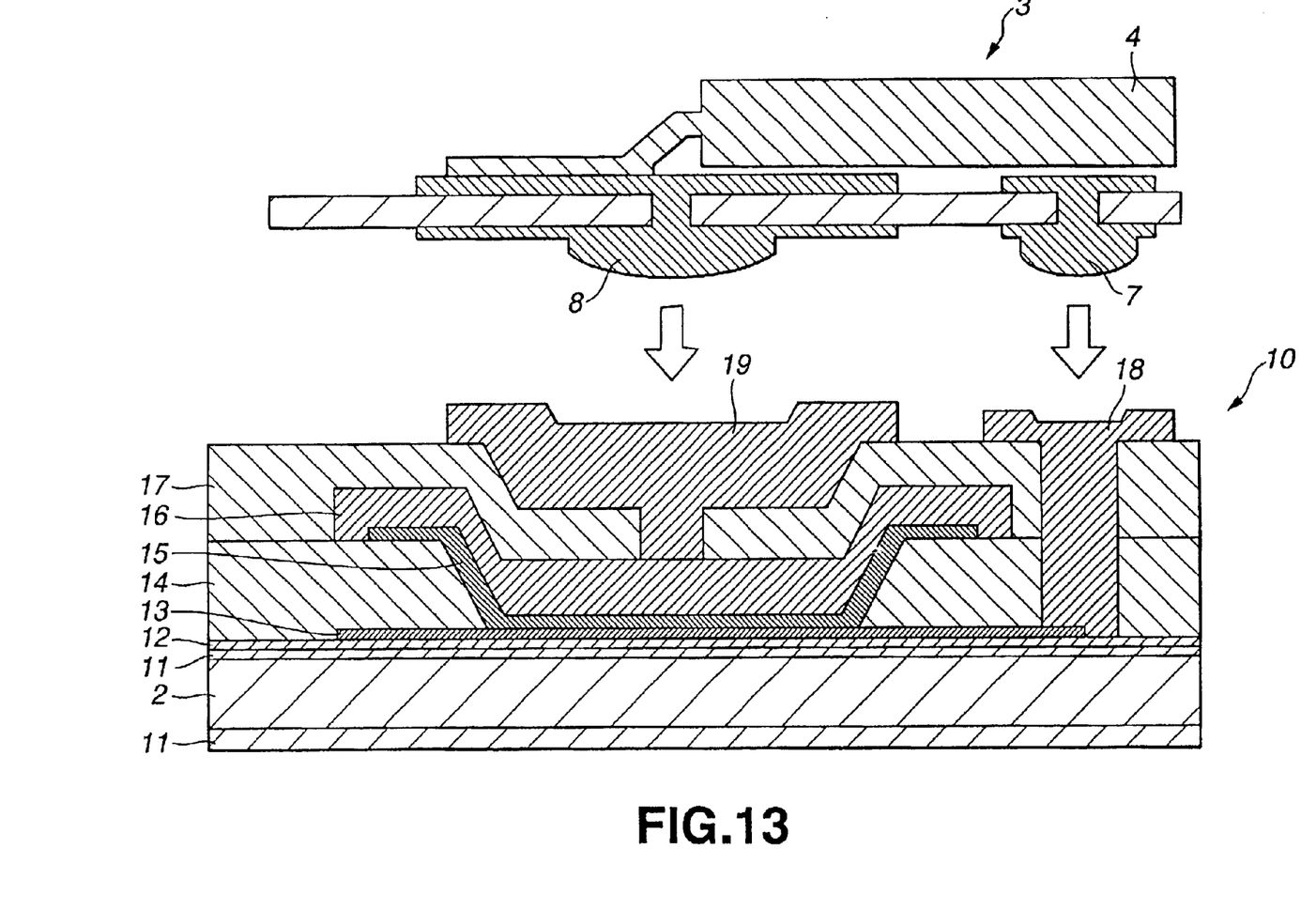
FIG. 13 is a cross-sectional view showing the state of arranging a drive circuit substrate on the back surface of an organic EL device according to the present invention.

As will be explained subsequently, the data line terminal 7 and/or the scan line terminal 8 provided on the drive circuit substrate 3 are connected by e.g., bump connection to a first electrode 18 and a second electrode 19 provided in the organic EL device 10, as shown in FIG. 13. The organic EL device 10 may be driven by the drive circuit substrate 3 supplying the device driving current to the organic EL device. By taking out the electrode terminal not from the lateral side but from the back side of the display screen, the large format display 1 can be realized in accordance with the passive matrix system.

The wiring length in the drive circuit areas S1 to S6, sub-divided in the panel substrate 2, is desirably not larger than 20 cm. If the wiring length exceeds 20 cm, the wiring resistance is increased to cause the problem of voltage drop. In light of the above, the size of each side of the drive circuit substrate 3 mounted on the panel substrate 2 is preferably not larger than 20 cm. Specifically, the drive circuit substrate 3 is desirably on the order of 77.76 mm×138.24 mm. By this drive circuit substrate 3, an organic EL devices of for example, 90×60 (=14400) pixels are driven. By subdividing the drive circuit substrate and reducing the wiring length, the voltage drop due to the wiring resistance can be eliminated to realize stable device driving.

By subdividing the panel and the drive circuit substrate mounting the organic EL devices, area-based management or repair becomes possible to maintain the quality of the display 1. For example, if malfunctions occur in the driving controlled of the display device in a display of the active matrix system exploiting the TFTs, the site of malfunction cannot be repaired so that the site ceases to emit light to prove dark spots. In the display of the present invention, area-based repair is possible even if the drive circuit for the organic EL devices falls into disorder, so that superior quality may be maintained without dark spots being produced in the display 1.

Figure 7:
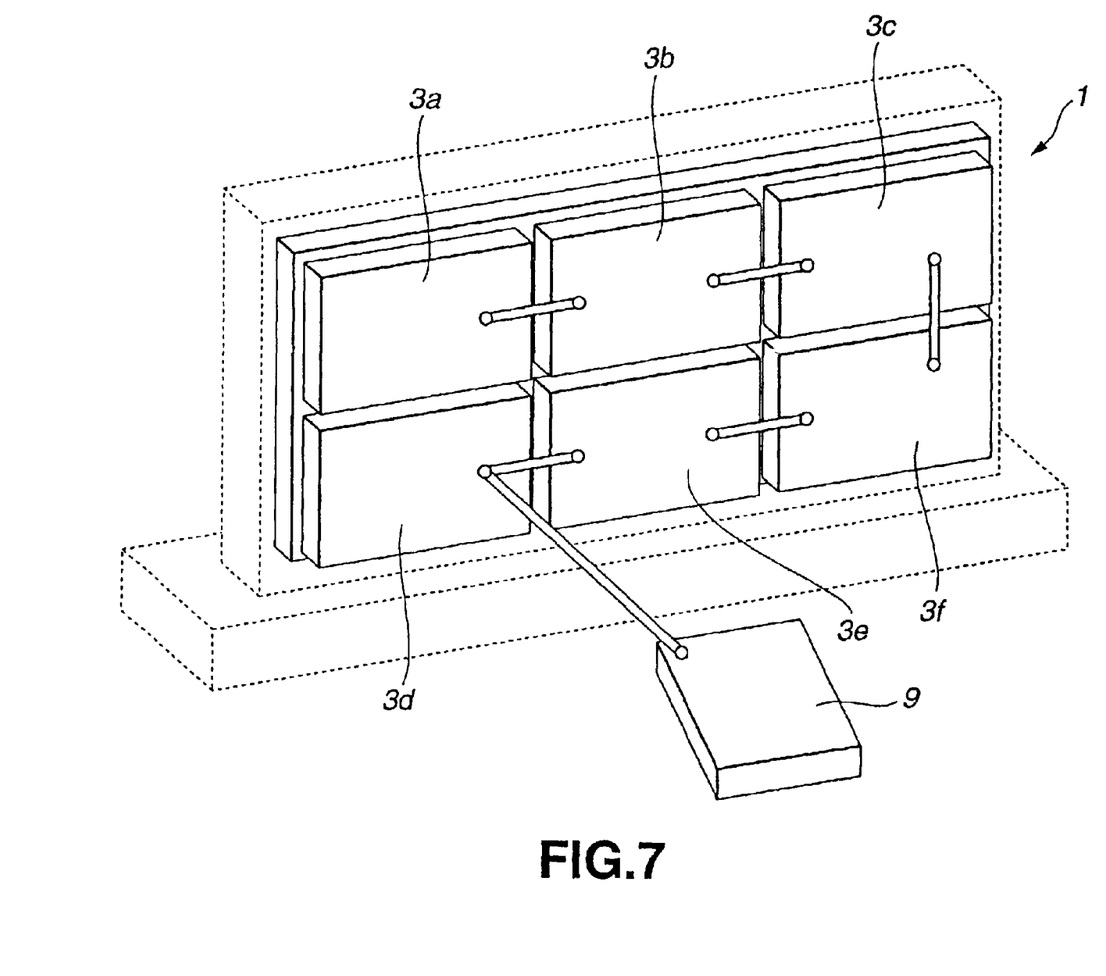
FIG. 7 is a schematic perspective view showing thestate of cascaded state of plural drive circuit substrates.

The drive circuit substrates 3a to 3f, subdivided in the panel, are interconnected in cascade. The organic EL devices may be driven by supplying the driving current corresponding to the picture signals or video signals, transmitted to the drive circuit substrates 3a to 3f from an image transferring unit 9 connected to outside, to the organic EL devices, to demonstrate a picture or an image on a display picture on the display 1, as shown in FIG. 7.

<Explanation of Organic EL Devices>

An illustrative structure of an organic EL device loaded on the display 1 embodying the present invention is hereinafter explained.

Figure 8:
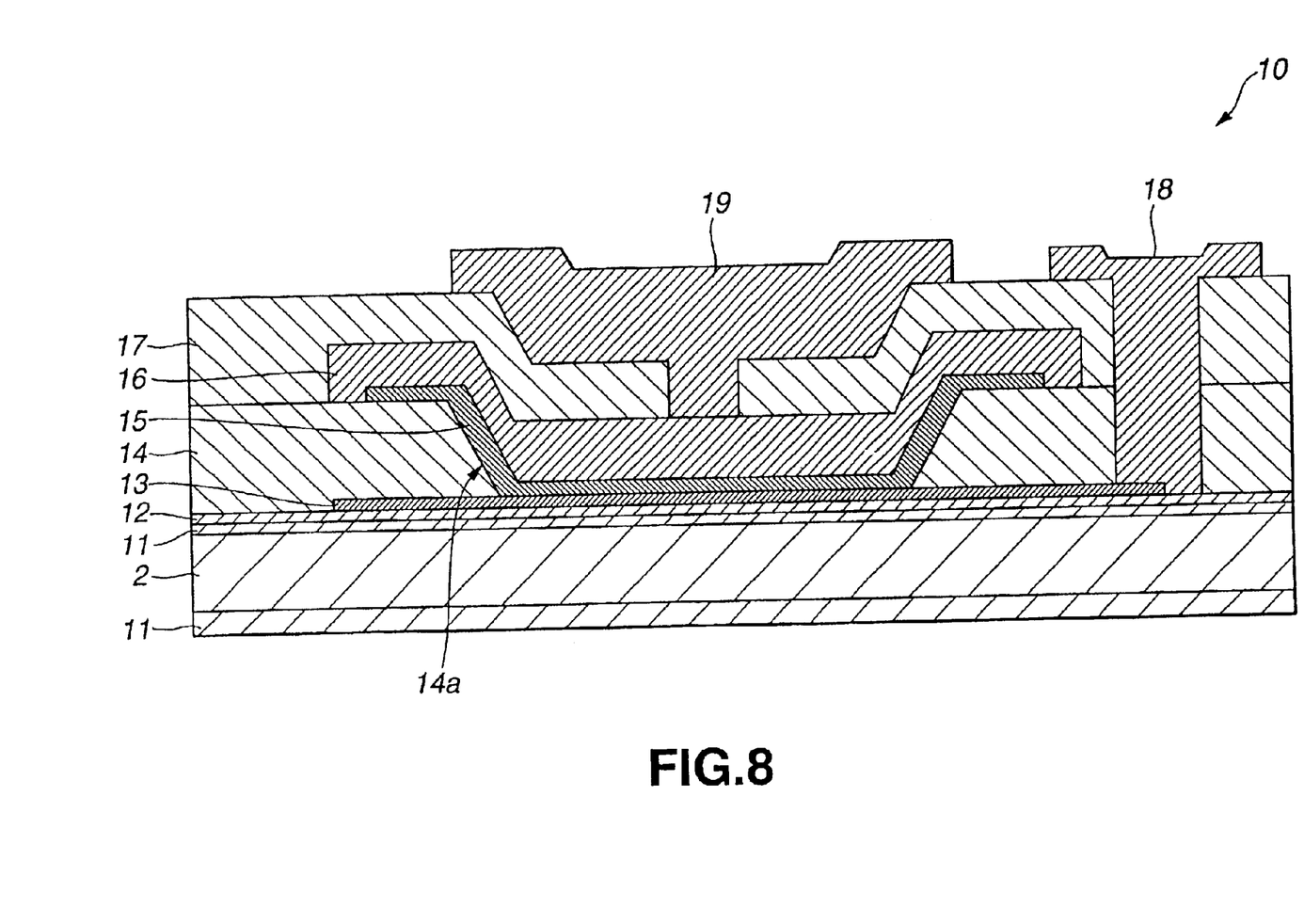
FIG. 8 is a cross-sectional view showing an illustrative structure of an organic EL device according to the present invention.

Referring to FIG. 8, the organic EL device 10 includes a transparent panel substrate 2, on both sides of which are formed gas barrier films 11, an electrode film 12 formed on one surface of the transparent panel substrate 2, a transparent electrode film 13 formed on the electrode film 12, a first insulating film 14 formed on the transparent electrode film 13, an organic EL film 15 formed on the first insulating film 14 and on the transparent electrode film 13, a metal electrode film 16 formed on the organic EL film 15 and a second insulating film 17.

There is no particular limitation to the panel substrate 2 provided that the function as a display device is met. For example, the panel substrate 2 may be formed of any suitable known materials transparent to visible light, such as glass or a plastic sheet or film.

In the organic EL device 10, the gas barrier films 11 against gases, such as moisture or oxygen, are provided on both sides of the transparent panel substrate 2. By providing the gas barrier films 11 on both sides of the transparent panel substrate 2, it is possible to prevent the moisture or oxygen from being intruded into the inside of the device to prevent deterioration of the organic EL material. These gas barrier films 11 are preferably endowed with anti-reflection characteristics. With the gas barrier films 11 having anti-reflection characteristics, it is possible to prevent reflection of the emitted light on the transparent panel substrate 2 to construct the organic EL display 1 with high transmittance.

Figure 9:
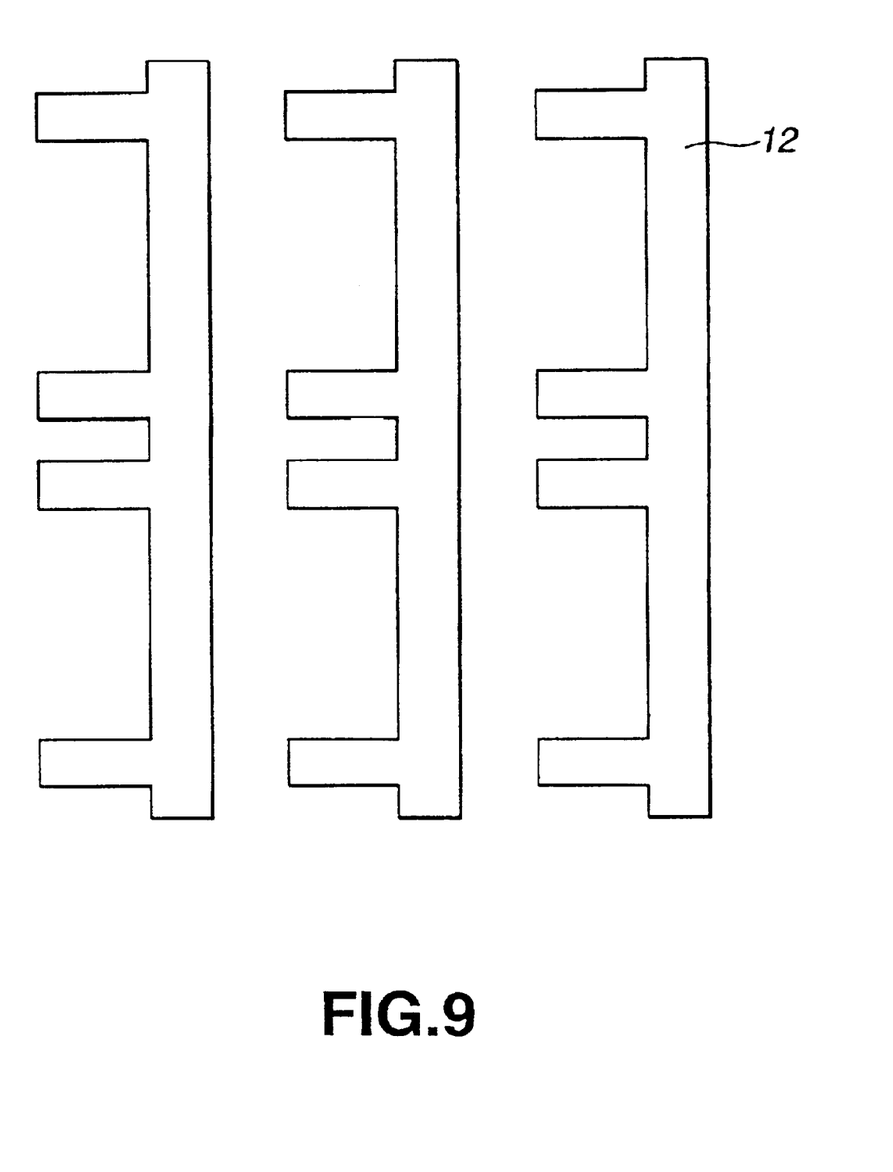
FIG. 9 is a plan view showing atypical shape of an electrode film shown in FIG. 4.
Figure 10:
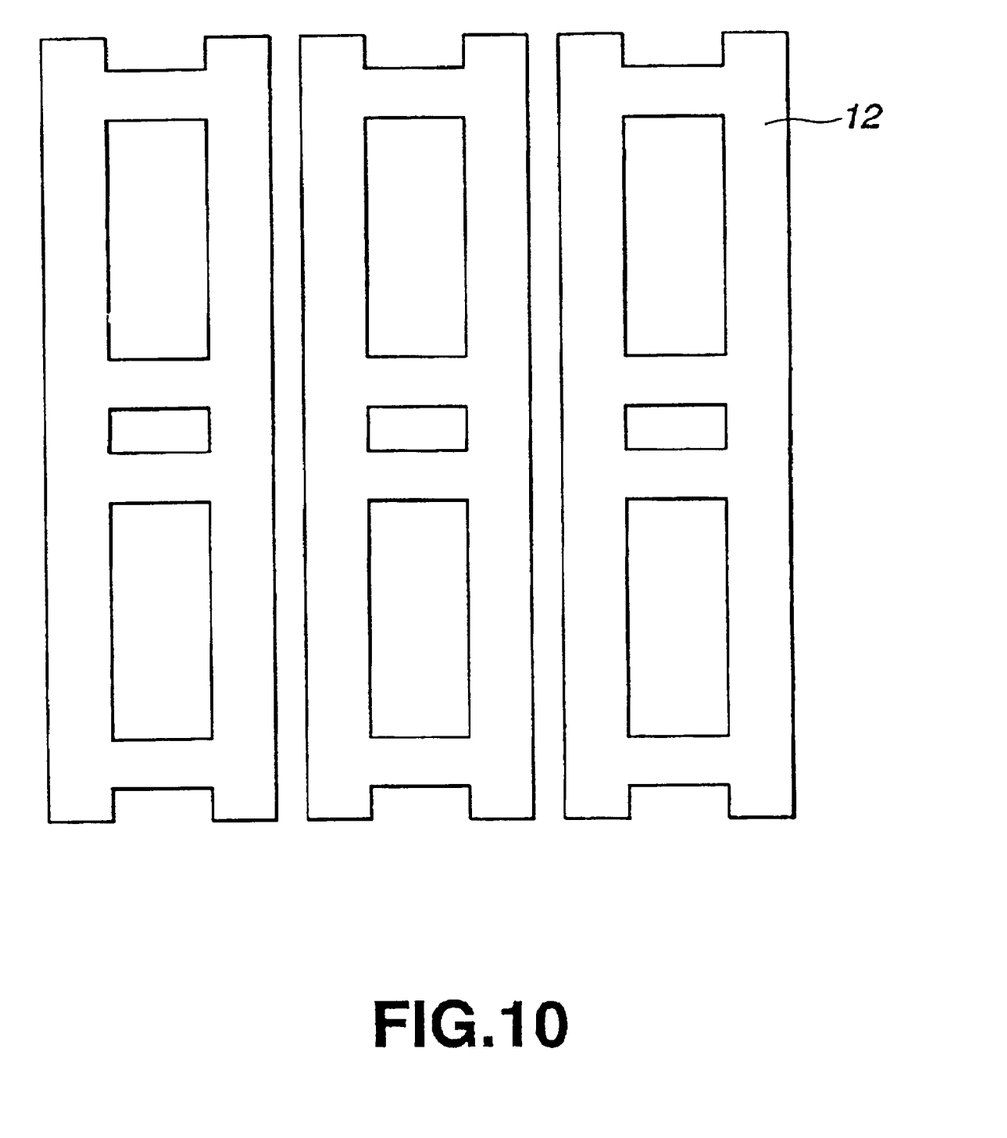
FIG. 10 is a plan view showing another typical shape of an electrode film shown in FIG. 4.

The electrode film 12 is formed on the panel substrate 2 in a comb shape, as shown in FIG. 9, or in a ladder shape, as shown in FIG. 10. This electrode film 12 is connected to a first electrode 18 formed to pass through the first insulating film 14 and the second insulating film 17. This first electrode 18 operates as an external anode of the organic EL device 10. That is, the electrode film 12 serves as an auxiliary electrode for supplying the current to the transparent electrode film 13 formed on the electrode film 12.

In constructing the display 1 using the organic EL device 10 as the light emitting element, a drive circuit for actuating the organic EL device 10 needs to be provided laterally of the organic EL device 10, in the conventional passive matrix system, thus proving a hindrance in increasing the display size, due to voltage drop ascribable to the wiring resistance of the drive circuit.

In the organic EL device 10, according to the present invention, the first electrode 18, operating as a terminal for capturing the current from outside, and a second electrode 19, as later explained, are passed through the first insulating film 14 or the second insulating film 17 to the opposite side of device with respect to the transparent panel substrate 2. Thus, the drive circuit for driving the organic EL device 10 may be provided not on the lateral side but on the back side of the device. So, with the display employing this organic EL device 10, there is no risk of the voltage drop caused by the wiring resistance of the drive circuit to enable the display to be increased in size.

Figure 11:
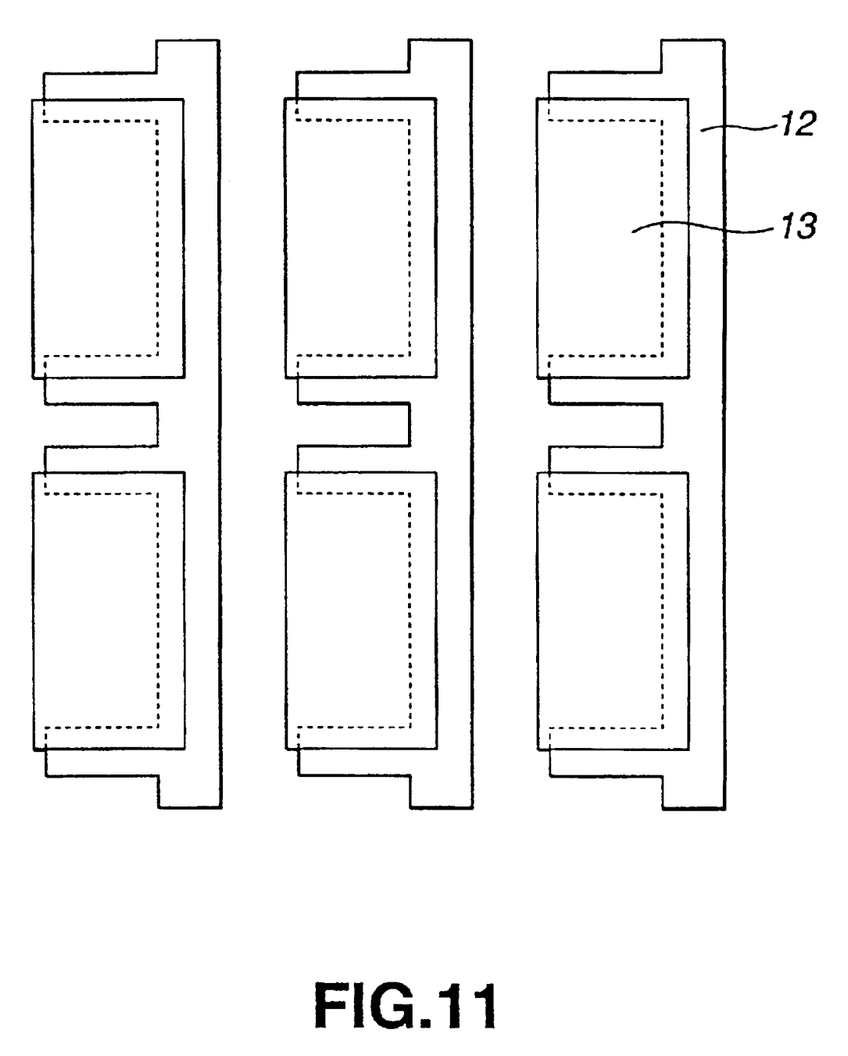
FIG. 11 is a plan view showing a typical transparent electrode film formed on the electrode film shown in FIG. 4.
Figure 12:
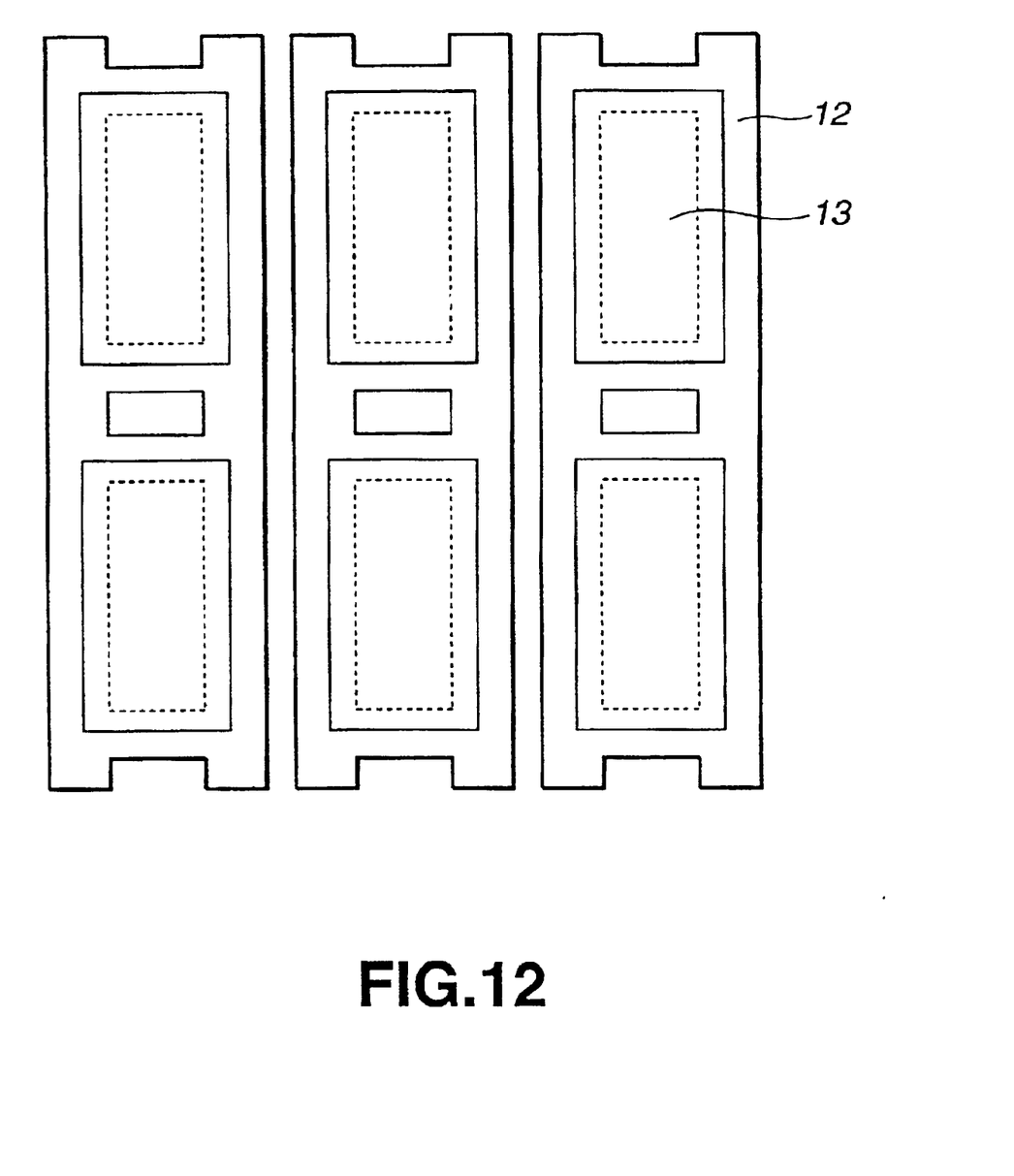
FIG. 12 is a plan view showing a typical transparent electrode film formed on the electrode film shown in FIG. 6.

The transparent electrode film 13 serves as an anode of the organic EL device 10 and is formed e.g., of ITO (indium tin oxide). Meanwhile, this transparent electrode film 13 is formed as an island for extending over the opening of the electrode film 4 formed in the comb or ladder shape and is connected to the first electrode 18 through the electrode film 12, as shown in FIGS. 11 and 12.

The first insulating film 14 is formed with an opening 14a over the transparent electrode film 13 and operates for separating neighboring devices.

The first insulating film 14 is forwardly tapered in which the opening degree of the opening 14a is increased in a direction away from the side transparent electrode film 13. If the first insulating film 14 is not tapered, the electrical field is concentrated in the ends of the transparent electrode film 13, organic EL film 15 and the metal electrode film 16 when the current is caused to flow to drive the organic EL device 10. Thus, there is the risk of the insulation being destructed to cause shorting to be produced across the transparent electrode film 13 and the metal electrode film 16. By the first insulating film 14 being forwardly tapered, it is possible to provide the insulation between the transparent electrode film 13, organic EL film 15 and the metal electrode film 16 to prevent the shorting across the transparent electrode film 13 and the metal electrode film 16 otherwise caused by concentration of the electrical field at the ends of the transparent electrode film 13, organic EL film 15 and the metal electrode film 16.

The material of the first insulating film 14 may, for example, be SiN, which exhibits not only the insulating properties but also the gas barrier function against the moisture or oxygen. By the first insulating film 14 having gas barrier characteristics, it is possible to prevent intrusion of the moisture or oxygen into the inside of the device to prevent deterioration of the organic EL film 15.

The organic EL film 15 is formed over the transparent electrode film 13 exposed from the opening 14a of the first insulating film 14 so as to surpass the opening 14a to extend over the first insulating film 14. This organic EL film 15 is of a multi-layered structure comprised of a positive hole transporting layer and a light emitting layer. If the current is supplied across the transparent electrode film 13 (anode) and the metal electrode film 16 (cathode), the positive holes implanted from the metal electrode film 16 reach the light emitting layer through the positive hole transporting layer, whilst the electrons implanted from the transparent electrode film 13 reach the light emitting layer, such that electron-positive hole recombination occurs in the light emitting layer. At this time, the light having a pre-set wavelength is emitted and radiated outwards from the side transparent panel substrate 2.

The metal electrode film 16 operates as a cathode for the organic EL device 10 and is formed over the organic EL film 15 to a size larger than that of the organic EL film 15. This metal electrode film 16 is connected to the second electrode 19 passed through the second insulating film 17.

The second insulating film 17 is formed for extending cover the entire device surface. The material of the second insulating film 17 may, for example, be SiN or AIN. This second insulating film 17 has not only insulating properties but also a gas barrier function against moisture or oxygen. With the insulating film having gas barrier characteristics, it is possible prevent intrusion of moisture or oxygen into the inside of the device to prevent deterioration of the organic EL film 15.

The second electrode 19 is formed e.g., of aluminum. This second electrode 19 is passed through the second insulating film 17 so as to be connected to the metal electrode film 16 to serve as an external cathode for the organic EL device 10. Similarly to the first electrode 18, the second electrode 19 is taken out from the back side of the display screen to enable the display employing the organic EL device 10 to be increased in size. Moreover, this second electrode 19 also has the gas barrier function against the moisture or oxygen. By the second electrode 19 having the gas barrier properties, it is possible prevent intrusion of moisture or oxygen into the inside of the device to prevent deterioration of the organic EL film 15.

These first and second electrodes 18, 19 are connected to the data terminal 7 and/or the scan line terminal 8 provided in a drive circuit substrate 3 by e.g., a bump, as shown in FIG. 13. The organic EL device 10 is driven by transmitting a device driving signal thereto from the drive circuit substrate 3. On this drive circuit substrate 3 is mounted e.g., a drive circuit IC 4.

In the organic EL device 10, according to the present invention, the organic EL film 15 is sealed by the gas barrier films 11, first insulating film 14, each having the gas barrier properties, metal electrode film 16 and the second insulating film 17, from both sides, to prevent the intrusion of the moisture or oxygen into the inside of the device substantially completely to prevent deterioration of the organic EL film 15.

Moreover, in this organic EL device 1, in which the component films of the organic EL device 10 are endowed with gas barrier properties, it is possible to simplify not only the device structure as compared to the conventional organic EL device adapted for sealing the entire device from outside, but also the process for the preparation of the device.

For driving the display 1, having the above-described organic EL device 10, the first electrode 18 and the second electrode 19 are connected by e.g., bumps to the terminal data line terminal 7 and/or the scan line terminal 8 provided in the drive circuit substrate 3 mounting the drive circuit 15, as shown in FIG. 13. This drive circuit substrate is not the large format drive circuit substrate which overlies the entire surface of the panel substrate 2, but is comprised of plural drive circuit substrates 3a to 3f associated with the drive circuit areas S1 to S6 subdivided in the panel substrate 2.

Moreover, since the organic EL device 10 is adapted for taking out the electrode terminal not from the lateral side but also from the back side of the display screen, the drive circuit substrate 3 for actuating the organic EL device 10 can be arranged on the back side of the device, so that the display may be increased in size.

The drive circuit substrates 3a to 3f, mounted on the back surface of the panel substrate 2, are connected in cascade, whilst the image transferring unit 9 is connected to outside, as shown in FIG. 7. From this image transferring unit 9, image or video signals are transmitted to the drive circuit substrates 3a to 3f, which then send the driving current corresponding to the image or video signals to the organic EL device to drive the organic EL device to demonstrate the image or the picture on the display screen of the display 1. With this display 1, the driving wiring length van be shorter by subdividing the drive circuit and the drive circuit substrate, so that, even if the display is increased in size, voltage drop ascribable to the resistance of the wiring can be eliminated to provide for stable driving of the organic EL device.

By slicing the panel substrate 2, on which plural organic EL devices are formed in a passive matrix system, from one sub-divided passive matrix to another, by bonding a corresponding number of the drive circuit substrates 3 on the back sides of the sliced panel substrate 2, and by providing for electrical connection, it is possible to prepare plural displays of different sizes in the same film forming system. This enables the large format display, employing the passive matrix system, to be manufactured without using the semiconductor process such as TFT (thin film transistor), to lower the production cost of the large format display.

Although the foregoing embodiment is directed to an organic EL display employing organic EL devices as display elements, the present invention is not limited thereto but may be applied to a liquid crystal display employing liquid crystal as a display element, a LED display employing a light emitting diode (LED) or to a plasma display.

What is claimed is:

1. A display apparatus comprising:

a panel substrate as a display screen;

a plurality of display devices arranged in a matrix configuration on a surface of said panel substrate opposite to the panel substrate surface operating as a display screen; and a plurality of drive circuit substrates arranged on said panel substrate and each having a drive circuit for driving each display element;

an area of said panel substrate carrying said display devices being sub-divided into a plurality of sub-areas by a plurality of driving lines adapted for driving said display devices, wherein the plurality of said drive circuit substrates being different substrates associated with said sub-areas.

2. The display apparatus according to claim 1 wherein said plurality of drive circuit substrates are arranged on the surface of said panel substrate carrying said display devices and are connected with bumps to said display devices through terminals.

3. The display apparatus according to claim 1 wherein said plurality of drive circuit substrates are interconnected in cascade connection to drive said display devices responsive to picture signals supplied from a signal furnishing device.

4. The display apparatus according to claim 1 wherein said display devices are arranged in a passive matrix system.

5. The display apparatus according to claim 1 wherein said display devices are organic electroluminescence devices.

6. The display apparatus according to claim 5 wherein each organic electroluminescence device includes a transparent substrate;

an electrode film formed on said transparent substrate;

a transparent electrode film formed on said electrode film;

a first insulating film formed on said transparent electrode film and having an opening over said transparent electrode film;

an organic electroluminescence light emitting film formed over a portion of said transparent electrode film exposed from said opening in said first insulating film, said organic electroluminescence light emitting film being larger in size than said opening and being formed over said first insulating film;

a metal electrode film formed on said organic electroluminescence light emitting film; and a second insulating film formed on said metal electrode film so as to be larger in size than both said organic electroluminescence light emitting film and said metal electrode film;

said first and second insulating films exhibiting gas barrier characteristics;

said opening being tapered so that its opening degree is increased in a direction away from the side transparent electrode film;

said transparent electrode film being electrically connected through said electrode film to a first electrode passed through said first and second insulating films formed so as to be exposed on said second insulating film, said metal electrode film being electrically connected to a second electrode passed through said second insulating film formed so as to be exposed on said second insulating film.

7. The display apparatus according to claim 6 wherein said electrode film is made in the form of a comb or a ladder.

8. The display apparatus according to claim 6 wherein said organic electroluminescence light emitting film is of a multi-layered structure including a positive hole transporting layer and a light emitting layer.

9. The display apparatus according to claim 1 wherein said display device is a light emitting diode.

10. The display apparatus according to claim 1 wherein said display device is a plasma device.

11. The display apparatus according to claim 1 wherein said display device is a liquid crystal device formed of a liquid crystal material.

* * * * *